(12) United States Patent
Haridass et al.

(10) Patent No.: US 7,430,800 B2
(45) Date of Patent: Oct. 7, 2008

(54) APPARATUS AND METHOD FOR FAR END NOISE REDUCTION USING CAPACITIVE CANCELLATION BY OFFSET WIRING

(75) Inventors: Anand Haridass, Austin, TX (US); Andreas Huber, Holzgerlingen (DE); Bao G. Truong, Austin, TX (US); Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 11/146,441

(22) Filed: Jun. 6, 2005

(65) Prior Publication Data

US 2006/0272851 A1     Dec. 7, 2006

(51) Int. Cl.
*H05K 3/02* (2006.01)
*H05K 3/10* (2006.01)

(52) U.S. Cl. .............................. 29/846; 29/851; 174/261

(58) Field of Classification Search ................. 174/255, 174/261; 29/846–853
See application file for complete search history.

(56) References Cited

U.S. PATENT DOCUMENTS

| | | | |
|---|---|---|---|
| 2,966,719 A | 1/1961 | Park | |
| 5,446,243 A | 8/1995 | Crowder et al. | |
| 5,508,938 A | 4/1996 | Wheeler | |
| 5,726,863 A | 3/1998 | Nakayama et al. | |
| 5,812,380 A | 9/1998 | Frech et al. | |
| 6,175,158 B1 * | 1/2001 | Degani et al. | ................ 257/777 |
| 7,269,813 B2 * | 9/2007 | Brown | .......................... 716/15 |
| 2005/0224961 A1 | 10/2005 | Farquhar et al. | |
| 2006/0214190 A1 | 9/2006 | Chun et al. | |

OTHER PUBLICATIONS

Chun et al., System and Method for Noise Reduction in Multi-Layer Ceramic Packages, U.S. Appl. No. 11/086,719, filed Mar. 22, 2005.
U.S. Appl. No. 11/538,531, filed Oct. 14, 2006, Chun et al.

* cited by examiner

*Primary Examiner*—Jeremy C Norris
(74) *Attorney, Agent, or Firm*—Stephen J. Walder, Jr.; Casimer K. Salys

(57) ABSTRACT

A mechanism for reducing the vertical cross-talk interference experienced in signal lines due to the inductive affects from signal lines in other signal planes of a multi-layer ceramic package is provided. With the apparatus and method, one or more vias in the multi-layer ceramic package may be removed from the structure to provide area through which an offset of the signal lines may pass. Because these offsets of the signal lines exist in parallel planes above or below each other, with no ground lines existing directly between these signal line offsets, a capacitive cross-talk is introduced into the signal lines. This capacitive cross-talk is opposite in polarity to the inductive cross-talk already experienced by the signal lines. As a result, the capacitive cross-talk tends to negate or reduce the inductive cross-talk thereby reducing the far end noise in the signal line.

11 Claims, 9 Drawing Sheets

APPARATUS AND METHOD FOR FAR END NOISE REDUCTION USING CAPACITIVE CANCELLATION BY OFFSET WIRING

BACKGROUND OF THE INVENTION

1. Technical Field

The present invention relates generally to an improved apparatus and method for noise reduction in multi-layered packages. More specifically, the present invention is directed to an apparatus and method for far end noise reduction in multi-layered ceramic packages using capacitive cancellation by offset wiring.

2. Description of Related Art

As Very Large Semiconductor Integrated (VLSI) circuits become more dense, there is a need in the art to have semiconductor packaging structures that can take full advantage of the density and speed provided by state of the art VLSI devices. Present day modules made of ceramic, typically multilayered ceramic modules, are normally mounted onto cards or boards, with cards or boards combined together to form the central processing unit (CPU) of a computer. The multilayer ceramic (MLC) modules typically have VLSI chips mounted on the top surface.

Multilayer modules are used for the packaging of electronic components, especially integrated circuit chips. Both single chip modules (SCM) and multi chip modules (MCM) are widely used. The most common type of such modules is the multilayer ceramic packaging module. In this type of module, the layers consist of a ceramic or glass-ceramic material. However, other types of thick film technologies are known, such as glass epoxy and Teflon. An example of multilayer ceramic packages is provided in U.S. Pat. No. 5,812,380, issued to Frech et al. on Sep. 22, 1998, which is hereby incorporated by reference.

As integrated circuit speeds and packaging densities increase, the importance of the packaging technology becomes increasingly significant. For example, as devices approach gigahertz speed, inductance effects in the package become more significant. Such inductance effects may arise from switching, for example, and are particularly problematic in power and ground leads. Inductance effects in the package can cause ground bounce, signal cross-talk and the like. Increasing circuit size and speed also impact the heat dissipation ability of the package.

VLSI and Ultra Large Semiconductor Integrated (ULSI) chips are especially designed for high performance applications and are thus limited by noise. The noise is caused by a high number of simultaneously switching off-chip drivers (OCD noise) and by a high number of simultaneously switching latches and the associated logic gates (logic noise). Both noise sources impact and restrict the on-chip and off-chip performance and jeopardize the signal integrity. Both noise sources generate noise due to line-to-line coupling and due to the collapse of the voltage-ground (GND) system.

The wiring layers in a typical multi-layer ceramic package are designed in a stacked tri-plate configuration with the signal wiring being sandwiched between upper and lower reference planes (typically alternating in voltage and ground polarity). These reference planes are meshed in a regular grid structure to allow via interconnections for the signal and power lines. This tri-plate structure is a controlled impedance environment that allows high speed signal propagation.

With increased signal rising and falling edge rates and bus signaling speeds, signals on these wiring layers interact with other signals on the signal layers above and below it through the meshed reference structure. This interaction, i.e. cross-talk, between high speed signals introduces inter-symbol interference (ISI) on the nets that severely limits the maximum signaling rates and performance on these nets. ISI is the distortion of a received signal, wherein the distortion is manifested in the temporal spreading and consequent overlap of individual pulses to the degree that the receiver cannot reliably distinguish between changes of state, i.e. between individual signal elements. At a certain threshold, inter-symbol interference will compromise the integrity of the received data.

SUMMARY OF THE INVENTION

In view of the above, it would be beneficial to have an apparatus and method that reduces the far end noise in signal lines of a multi-layer ceramic package. Moreover, it would be beneficial to have such an apparatus and method that does not increase the cost of the multi-layer ceramic package appreciably. Furthermore, it would be beneficial to have such an apparatus and method that does not incur any wire channel penalty.

The present invention provides a mechanism for reducing the vertical cross-talk interference experienced in signal lines due to the inductive affects from signal lines in other signal planes of a multi-layer ceramic package. With the present invention, one or more vias in the multi-layer ceramic package are removed from the structure to provide area through which an offset of the signal lines may pass. That is, extra signal line length is added to the signal lines such that the signal line extends into the area where the via would have been, and then returns to the original path of the signal line in the signal plane.

Because these offsets of the signal lines exist in parallel planes above or below each other, with no ground lines existing directly between these signal line offsets, a capacitive cross-talk is introduced into the signal lines. This capacitive cross-talk is opposite in polarity to the inductive cross-talk already experienced by the signal lines. As a result, the capacitive cross-talk tends to negate the inductive cross-talk thereby reducing the far end noise in the signal line.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

Figure 1A:
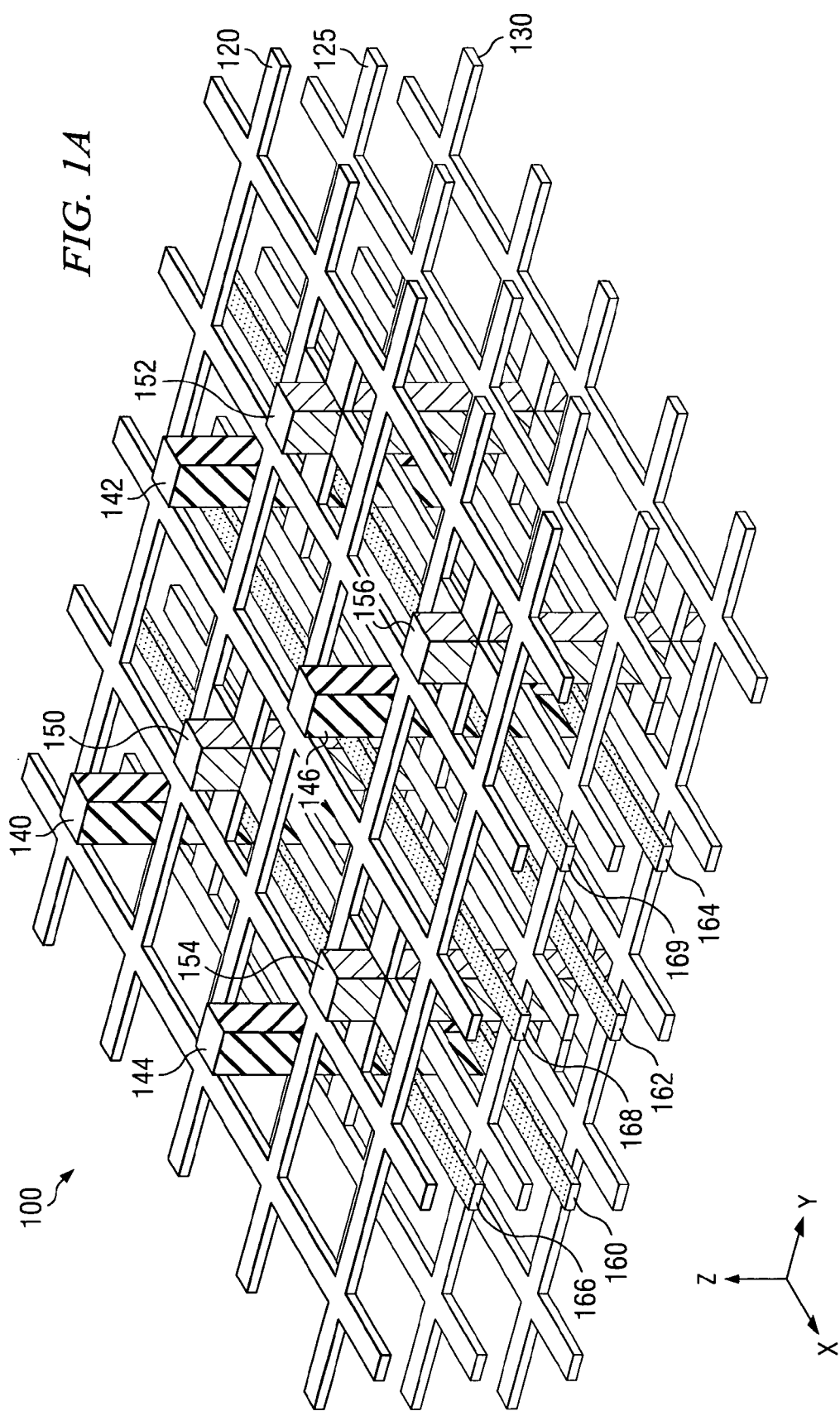
FIGS. 1A-1C are exemplary diagrams illustrating a multi-layered ceramic package in accordance with a known structure.
Figure 1B:
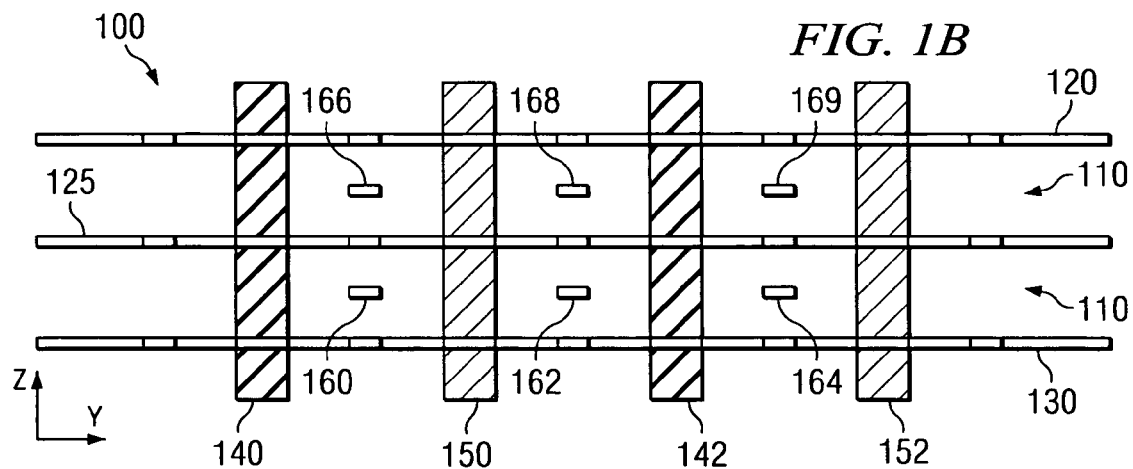
Figure 1C:
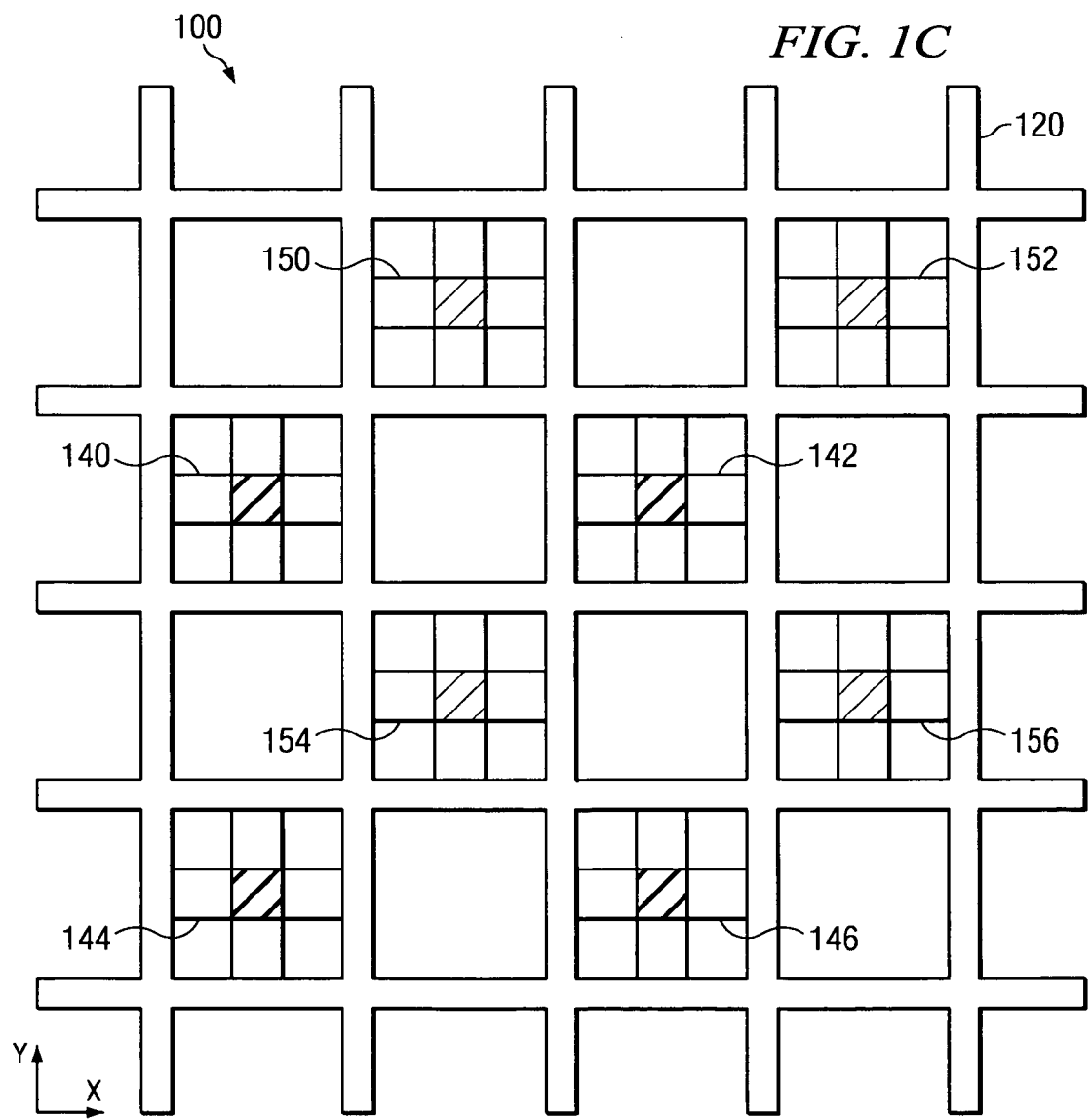

The present invention provides an improved multi-layered ceramic package configuration in which one or more vias are removed from the configuration in order to provide space for additional signal line length and an area where capacitive cross-talk is introduced to cancel/reduce the magnitude of the far end noise peak. In order to illustrate the primary configuration differences between the improved multi-layered ceramic package configuration and known multi-layered ceramic packages, reference will first be made to FIGS. 1A-1C which illustrate various views of a known multi-layered ceramic package. FIG. 1A is an exemplary isometric view diagram illustrating a multi-layered ceramic package in accordance with a known structure. FIG. 1B is an exemplary cross-sectional view of the multi-layered ceramic package in accordance with a known structure. FIG. 1C is a top view of a ceramic package in accordance with a known structure.

As shown in FIGS. 1A-1C, the multi-layered ceramic package 100 includes signal planes 110 (FIG. 1B) sandwiched between reference mesh planes 120, 125 and 130. The signal planes 110 are formed as signal wires formed in a ceramic substrate. The reference mesh planes 120, 125 and 130 are ceramic layers with metal wire mesh formed therein. In the depicted example, the metal wire mesh of the reference mesh planes 120 and 130 provide ground (gnd) lines and reference mesh plane 125 provides ground (gnd) lines. The vdd lines are accessed by vertical vias 140-146 and x-hatch structures with which the vdd vias tie into the vdd mesh plane 125. The gnd lines are accessed by ground vias 150-156 and x-hatch structures with which the gnd vias tie into the ground mesh planes 120 and 130. Additional signal planes 110 and mesh planes 120, 125 and 130 may be provided in the multi-layered ceramic package 100 as is desired for the particular implementation. FIG. 1C illustrates the x-hatch structures in the reference planes for tying the vdd and gnd vias 140-146 and 150-156 to their respective voltage and ground lines in the reference planes 120 and 130.

FIG. 1B illustrates the planes 110-130 in greater detail. As shown in FIG. 1B, the signal planes 110 are separated from one another by reference mesh planes 120, 125 and 130. Because these reference mesh planes 120, 125 and 130 do not exert much influence on the signal planes 110, the signal lines 160-169 in the signal planes 110 are inductively coupled to one another. This gives rise to noise in the signal lines due to cross-talk interference. Cross-talk is the undesired, primarily inductive, interaction between two adjacent metal lines in a multi-layered metallization scheme of an integrated circuit.

As discussed above, as signal rising and falling edge rates and bus signaling speeds increase, signal lines 160-169 on these signal layers 110 interact with other signal lines 160-169 on the same signal layer 110 and other signal layers 110 above and below it through the reference mesh planes 120, 125 and 130. This cross-talk interaction between high speed signals introduces noise and inter-symbol interference (ISI) on the nets that severely limits the maximum signaling rates and performance on these nets. Thus, in order to be able to achieve higher signaling rates and performance, it is necessary to minimize the noise in signal lines 160-169 of the signal planes 110. Therefore, it is necessary to have a structure that minimizes the vertical cross-talk interference experienced by signal lines in one signal plane due to signal lines in other signal planes.

The present invention provides a mechanism for reducing the vertical cross-talk interference experienced in signal lines due to the inductive affects from signal lines in other signal planes of a multi-layer ceramic package. With the present invention, one or more vias in the multi-layer ceramic package are removed from the structure to provide area through which an offset of the signal lines may pass. That is, extra signal line length is added to the signal lines such that the signal line extends into the area where the via would have been, and then returns to the original path of the signal line in the signal plane.

Because these offsets of the signal lines exist in substantially parallel planes above or below each other, with no vdd lines existing directly between these signal line offsets, a capacitive cross-talk is introduced into the signal lines. This capacitive cross-talk is opposite in polarity to the inductive cross-talk already experienced by the signal lines. As a result, the capacitive cross-talk tends to negate the inductive cross-talk thereby reducing the far end noise in the signal line.

In an alternative embodiment of the present invention, the signal line offsets are provided in an area of the signal plane where there are no vias present. The signal line offsets are formed such that they extend into the area and then return to an original signal line path in the signal plane. This area is aligned with the power/ground mesh planes such that no ground/power lines are directly between the signal lines of respective signal line planes. As a result, capacitive cross-talk is introduced into the signal lines which reduces the far end noise in the signal lines. This alternative embodiment has the benefit of not having to remove a via from the multi-layer ceramic package structure. However, this alternative embodiment can be implemented only in regions that do not have signal vias.

It should also be appreciated that in both embodiments may be combined such that signal line offsets may be formed in areas where there are no vias present and in other areas where vias are removed to permit the formation of signal line offsets in accordance with the present invention. A signal line offset insertion engine may be provided with logic for determining where and when to use either approach in a single multi-layer ceramic package design, for example.

In order to make the enhancements of the present invention easier to identify in the figures, the following figures eliminate the top and bottom layers of the tri-plate multi-layer ceramic package shown in FIGS. 1A-1C. It should be appreciated that, while the following figures eliminate these layers from the depictions of the present invention, the actual multi-layer ceramic package produced by the present invention will include such layers and that the elimination of these layers is only for ease of identification of the improvements provided by the present invention.

Figure 2A:
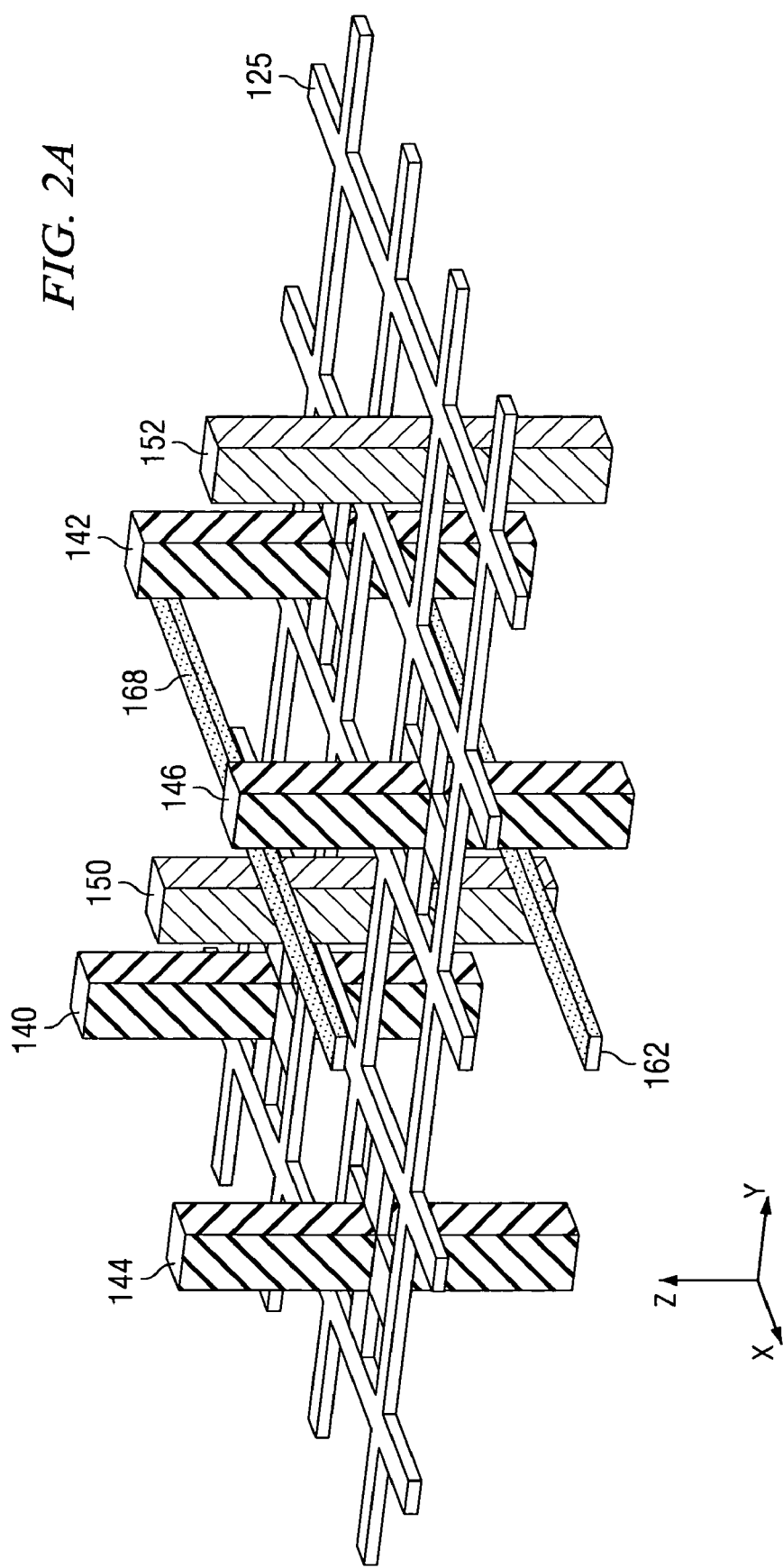
FIGS. 2A-2C are figures illustrating the multi-layer ceramic package of FIGS. 1A-1C in which the top and bottom layers are eliminated.
Figure 2B:
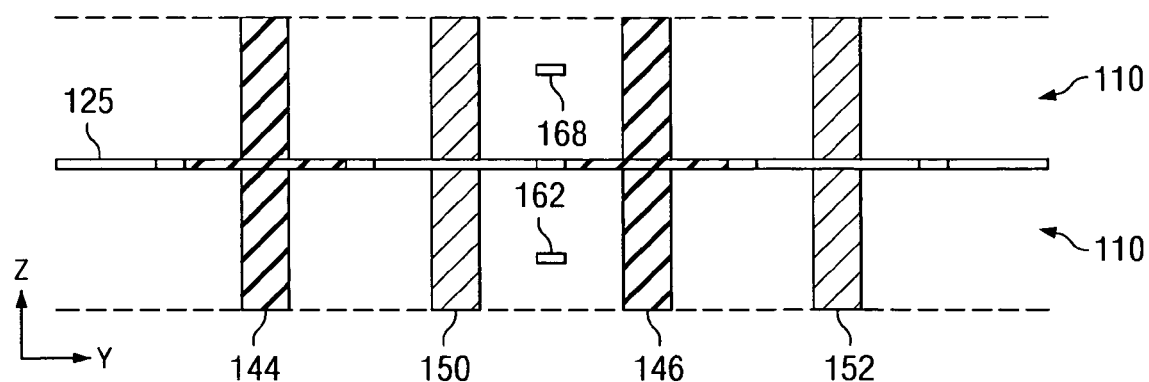
Figure 2C:
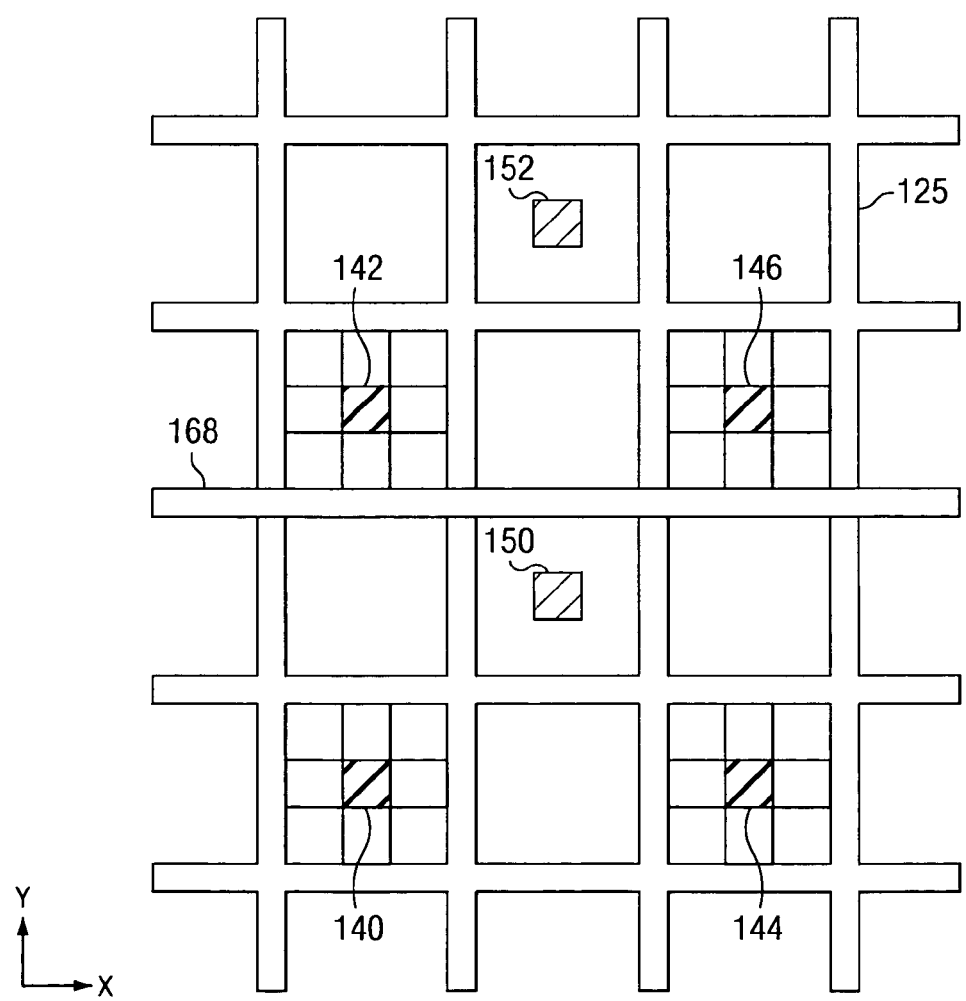

As a basis for comparison, FIGS. 2A-2C are figures illustrating the multi-layer ceramic package of FIGS. 1A-1C in which the top and bottom layers 120 and 130 are eliminated. The structure shown in FIGS. 2A-2C is identical to that shown in FIGS. 1A-1C with only the top and bottom layers 120 and 130, and vias 154 and 156, being removed for ease of viewing the internal elements of the structure. The elimination of the top and bottom layers 120 and 130, and vias 154 and 156, in these figures is not intended to represent a different structure from that shown in FIGS. 1A-1C.

Figure 3A:
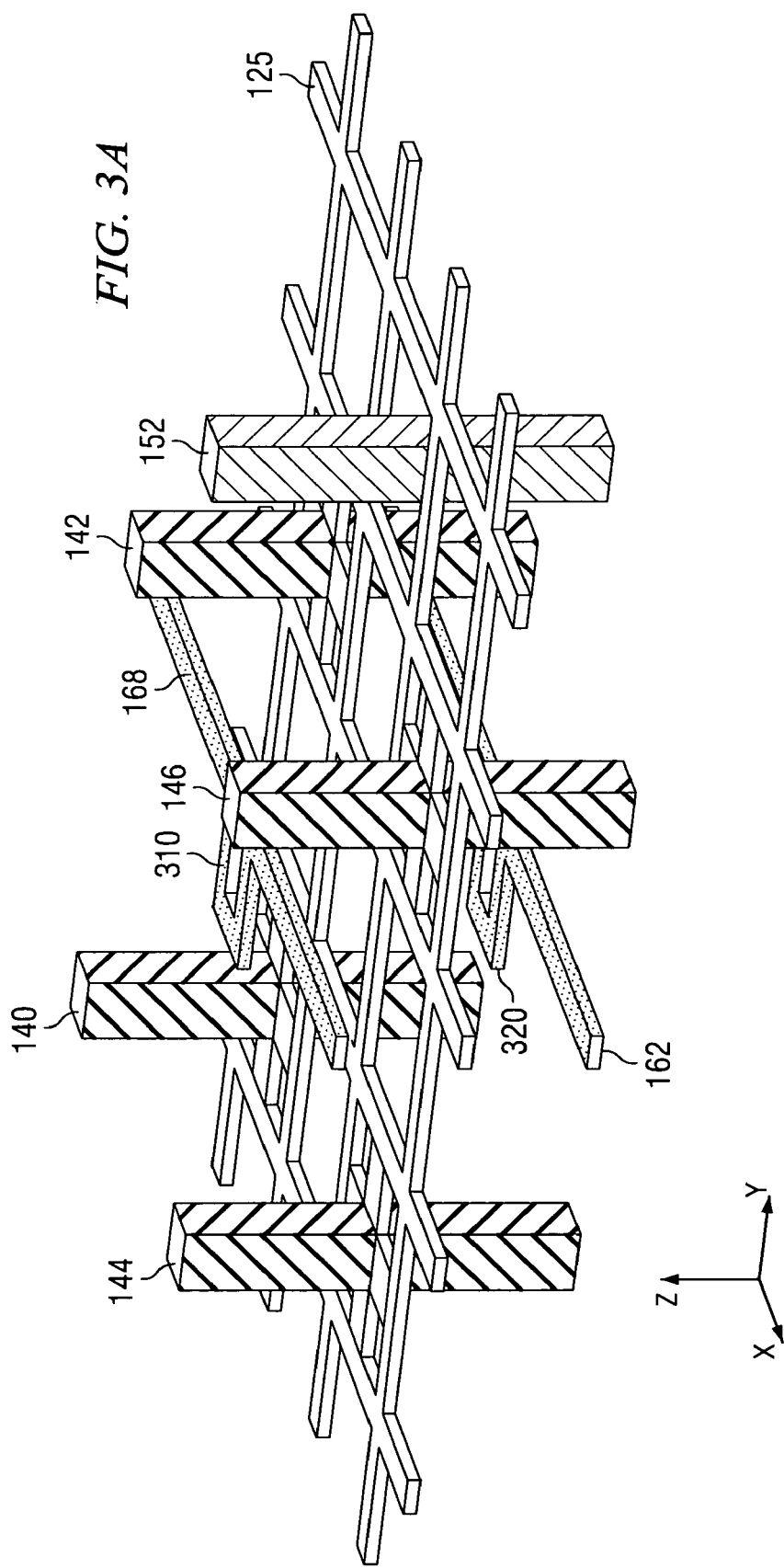
FIGS. 3A-3C are exemplary diagrams illustrating a multi-layered ceramic package in accordance with one exemplary embodiment of the present invention.
Figure 3B:
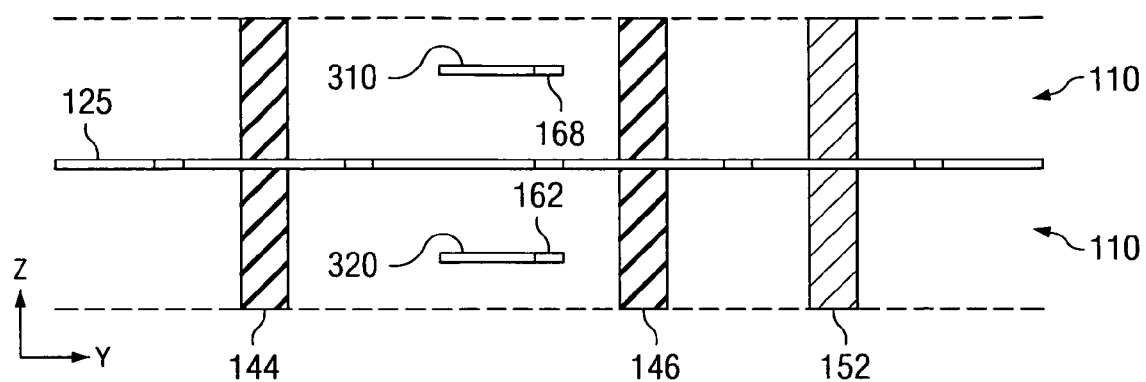
Figure 3C:
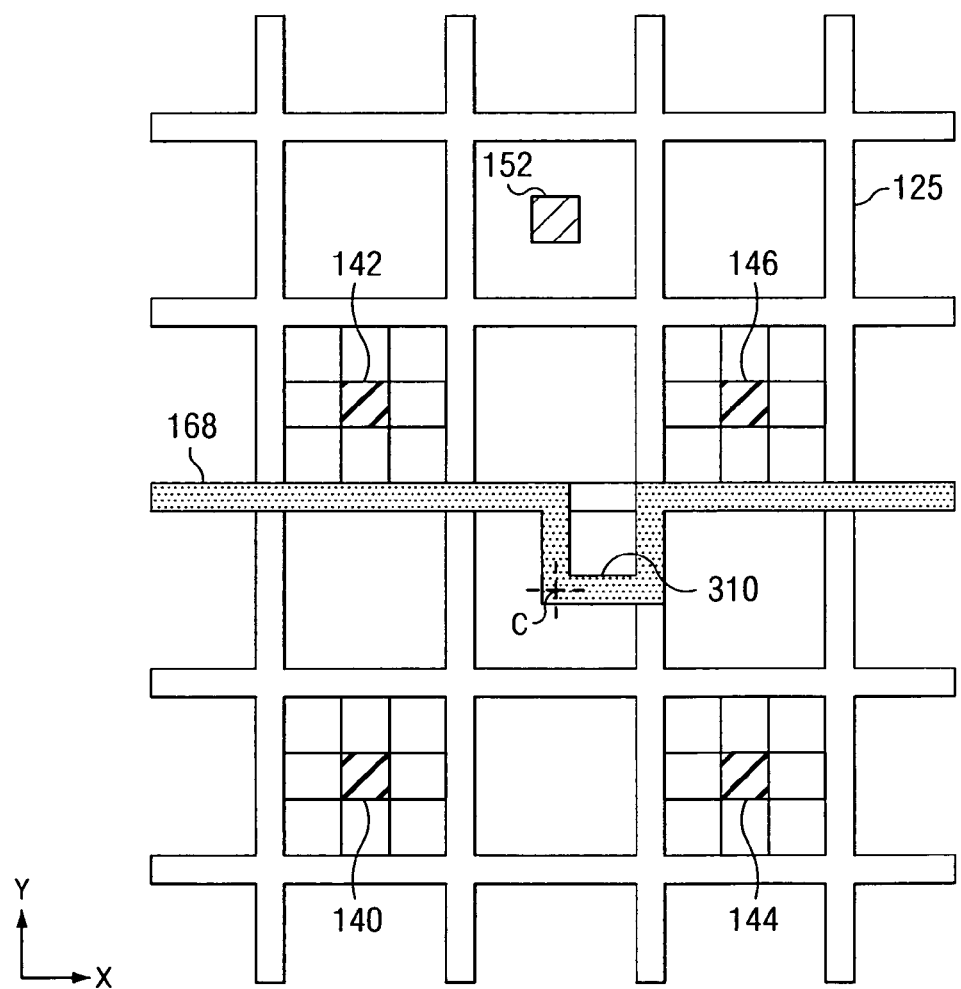

FIGS. 3A-3C are exemplary diagrams illustrating a multi-layered ceramic package in accordance with one exemplary embodiment of the present invention. As with FIGS. 2A-2C above, the top and bottom layer of the multi-layer ceramic package are not shown in FIGS. 2A-2C in order to facilitate identification of the improvements made by the present invention.

As shown in FIGS. 3A-3C, when compared with the similar structure shown in FIGS. 2A-2C, with a first embodiment of the present invention, the via 150 is removed from the multi-layer ceramic package structure. While this via 150 may be removed, the x-hatch structures (shown in FIGS. 1A-1C) in the power/ground mesh reference planes 120 and 130 for tying the via 150 to its respective voltage/ground lines in the reference planes 120 and 130 may still be present in the reference planes 120 and 130.

In the area of the signal planes 110 through which the via 150 would have passed, signal line offsets 310 and 320 are formed. These signal line offsets extend from the original signal line path to a point C aligned with the center of a grid square in the mesh structure of the reference mesh plane 125. The signal line offsets 310 and 320 then extend from the center point C back to the original signal line path to form a "U" shaped offset. That is, the signal line offsets 310 and 320 depicted in FIGS. 3A-3C are comprised of three approximately orthogonally arranged legs: a first leg extending from the original signal line path to the center point C of a grid square where the via 150 would have been; a second leg extending from the center point C in an approximately orthogonal direction from the first leg to a point in the signal plane 110 aligned with a ground/power line in the reference mesh plane 125; and a third leg extending approximately orthogonally from the end of the second leg back to the original signal line path. While the offsets 310 and 320 shown in FIGS. 3A-3C are "U" shaped, the present invention is not limited to such a configuration and any shaped signal line offset may be used without departing from the spirit and scope of the present invention.

The first and second legs of the signal line offsets 310 and 320 do not have any ground/power lines directly between them in the area of the grid square (the ground/power lines are offset from the signal lines and thus, have less of a shielding influence on the signal lines). As a result, there is no ground/power line to shield the affects of a signal line on its neighboring signal lines in signal planes both above and below it. Thus, the signal line offsets 310 and 320 impose a capacitive cross-talk interference on each other. This capacitive cross-talk interference, or noise, is opposite in polarity to that of the inductively induced cross-talk already experienced by the signal lines 162 and 168. As a result, the capacitive cross-talk noise tends to negate or reduce the inductively induced cross-talk noise, thereby resulting in a lower far end noise peak.

To illustrate this reduction in cross-talk interference and far end noise peak, consider the following relationships. For signal lines that are coupled over a length 1, the far end noise increases linearly with coupled length and is inversely related to rise time ($t_r$). The noise voltage is given approximately by the equation:

$$V_{FE} = 0.5 V_i (K_C - K_L)(L_{11} C_{11})^{1/2} (1/t_r)$$

where $V_{FE}$ is the far end noise voltage, $V_i$ is an input voltage, $K_C$ is a capacitive coupling factor, $K_L$ is an inductive coupling factor, $L_{11}$ is self inductance of line 1 ($L_{22}$ would be self inductance of line 2 and $L_{12}$ would be the mutual inductance between lines 1 and 2), $C_{11}$ is self capacitance of line 1 ($C_{22}$ would be self capacitance of line 2 and $C_{12}$ would be the mutual capacitance between lines 1 and 2), $t_r$ is the rise time of the signal on the aggressor signal wire. The capacitive and inductive coupling factors may be determined as $K_C = C_{12}/C_{11}$ and $K_L = L_{12}/L_{11}$. The result of the above equation is proportional to ($K_C - K_L$).

For a positive signal transition (e.g., 0→1 signal transition) on line 2, the inductive portion of coupled noise causes a negative pulse (i.e. for a positive transition, or 0 to +Ve voltage change, the noise pulse is a negative transition, or 0 to −Ve transition) on line 1 ($V_L$) and the capacitive portion of coupled noise causes a positive pulse on line 1 ($V_C$). In typical multi-layer ceramic packages, $V_L > V_C$ in magnitude. This results in an overall negative (inductive) pulse at the far end of the signal line. Thus, if the magnitude of $V_C$ were to be increased, the result would be a smaller negative pulse and thus, less far end noise.

The present invention achieves such a result by the introduction of the signal line offsets which introduce a larger capacitive cross-talk between two neighboring signal lines in a multi-layer ceramic package. Within the intended operational frequencies of the described structure, the amount of noise that is introduced into the signal lines by way of the signal line offsets is primarily a function of the signal edge rates and not the frequencies of the signals themselves. Thus, the frequencies of the signals in the described structure do not give rise to problems associated with tuned frequencies. At very large signal frequencies approach it is possible that problems associated with tuned frequencies may become a consideration. However, at this point, it would most likely be necessary to revise the basic mesh structure of the multi-layer ceramic package as well as reconsider the frequency affects of the offset structure of the present invention.

Figure 4A:
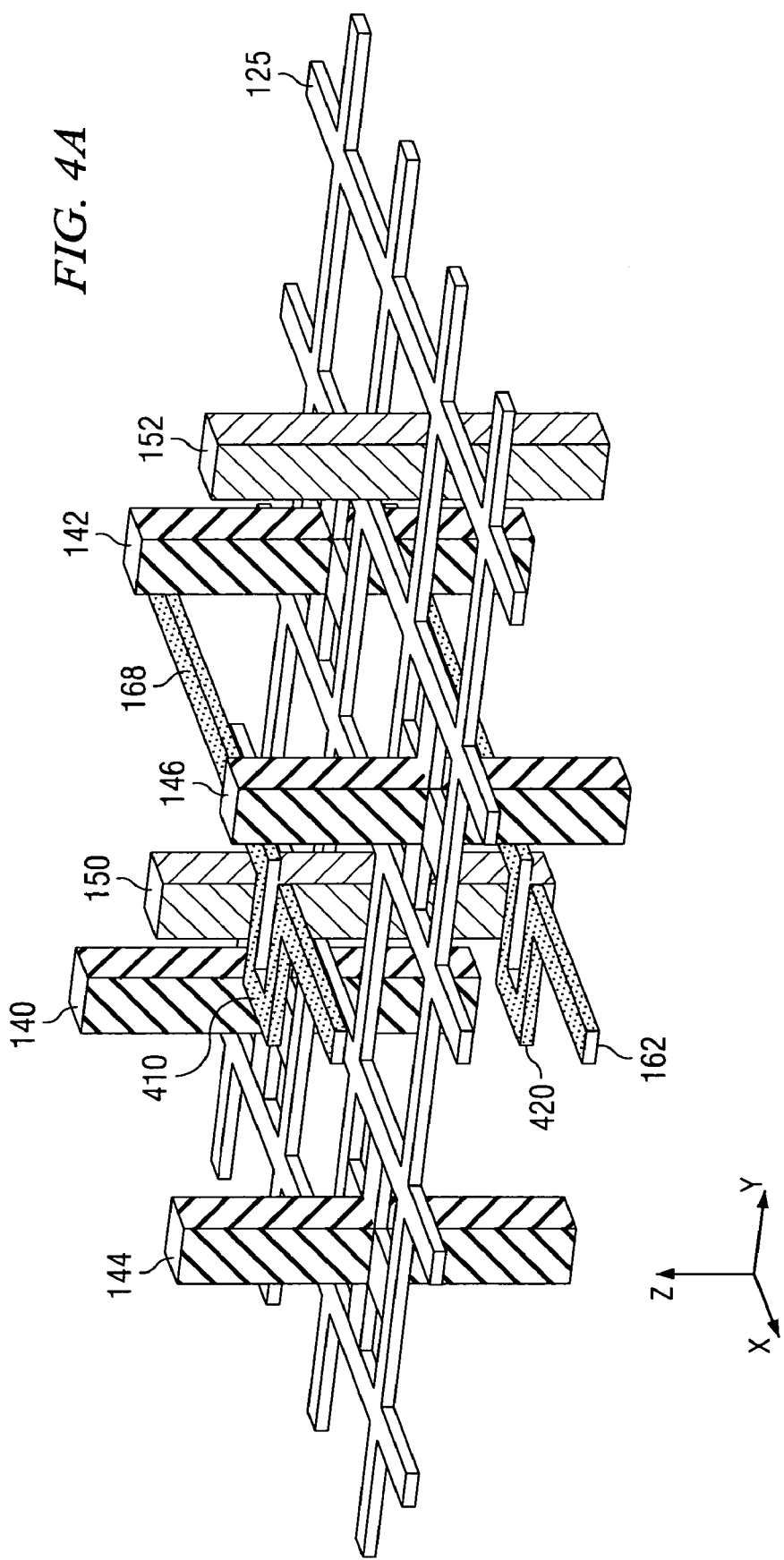
FIGS. 4A-4C illustrate an exemplary alternative configuration for providing signal line offsets in accordance with another exemplary embodiment of the present invention.
Figure 4B:
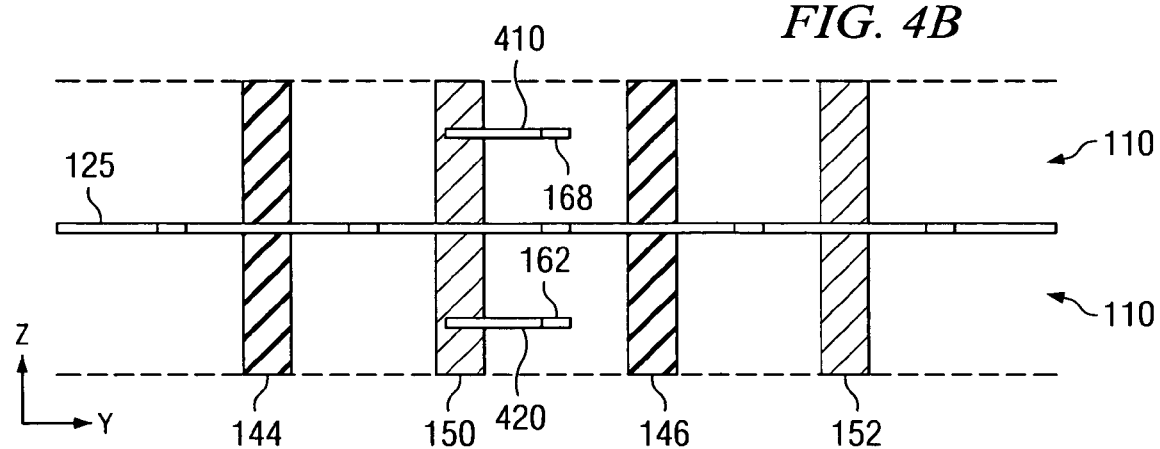
Figure 4C:
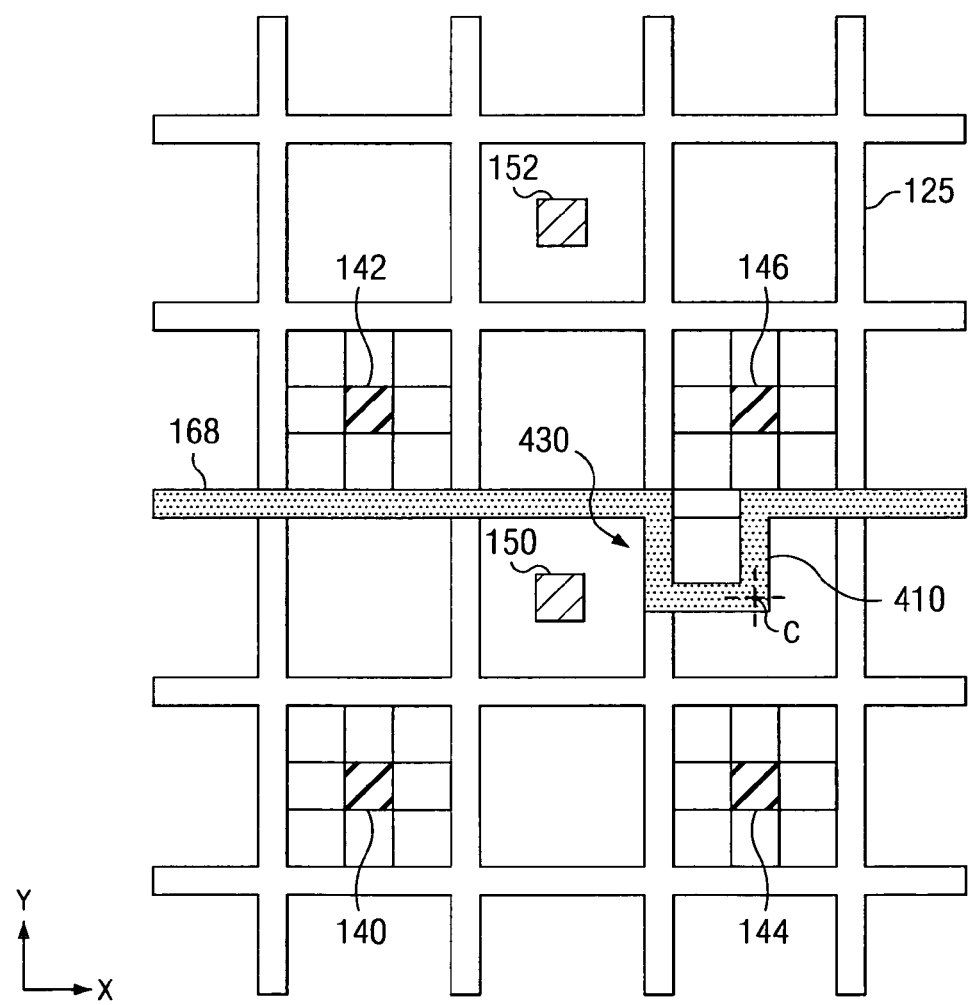

FIGS. 4A-4C illustrate an exemplary alternative configuration for providing signal line offsets in accordance with another exemplary embodiment of the present invention. As shown in FIGS. 4A-4C, the structure is essentially the same as that shown in FIGS. 3A-3C with the exception that the power/ground via 150 is not removed and the signal line offsets 410 and 420 are provided in a portion of the signal plane 110 aligned with a grid square where no via was previously present. That is, referring back to FIGS. 2A-2C, the grid square 430 did not have a power/ground or signal via running through the multi-layer ceramic package in the area of this grid square 430. Thus, there is no need to remove a via in order to extend the signal wiring into this area.

The signal line offsets 410 and 420 have the same configuration and characteristics as the signal line offsets 310 and 320. Thus, in a similar manner as set forth above with regard to signal line offsets 310 and 320, a capacitive cross-talk is introduced by the presence of these signal line offsets 310 and 320 in close proximity to each other without a directly interposed ground/power line between them. Therefore, a similar result as that obtained from the configuration set forth in FIGS. 3A-3C is obtained. In fact, as will be shown hereafter, a greater reduction in far end noise is achievable through the use of this alternative configuration.

Using the above relationships, the following table, Table 1, shows the $K_C$, $K_L$ and $K_C + K_L$ values for a glass ceramic multi-layer package having the original multi-layer ceramic package configuration illustrated in FIGS. 1A-1C and 2A-2C as well as the configurations shown in FIGS. 3A-3C and 4A-4C:

TABLE 1

Coupling Factors for Original Structures
and Structures of the Present Invention

|  | Original Structure (FIGS. 1A–1C; 2A–2C) | Signal Line Offset Structure 1 (FIGS. 3A–3C) | Signal Line Offset Structure 2 (FIGS. 4A–4C) |
| --- | --- | --- | --- |
| $K_C$ | −0.0156 | −0.0408 | −0.0415 |
| $K_L$ | +0.0385 | +0.0530 | +0.0502 |
| $K_C + K_L$ | 0.0229 | 0.0122 | 0.0087 |

For each of the signal line offset structures 1 and 2, a glass multi-layer ceramic package was simulated using 50 ohm source impedance, 50 ohm termination impedance, 5 cm long signal lines, and a rise time of 100 ps. With this simulation, the following reductions in far end noise in each alternative structure 1 and 2 were observed as a function of how many times the signal offset structure of the present invention was implemented along the length of the signal line:

TABLE 2

Reduction in FE Noise for Original Structure
and Structures of Present Invention

|  | % Reduction in FE Noise for Structure 1 | % Reduction in FE Noise for Structure 2 |
| --- | --- | --- |
| Original Structure (0% of length) | — | — |
| Offset implemented for 8% of total length | −8.5% | −8.5% |
| Offset implemented for 16% of total length | −14.3% | −20.0% |
| Offset implemented for 33% of total length | −25.7% | −37.2% |

As seen from the above results, by implementing the structures of the present invention, depending upon the extent to which the structures are replicated along the length of the signal line between 0 and 33% of the total length, a reduction of approximately 0 to 37.2% in the far end noise of a signal line may be achievable. Thus, by using the signal line offsets of the present invention, a dramatic improvement in the far end noise of signal lines in a multi-layer ceramic package may be achieved. As a result, the overall affects of cross-talk between high speed signals and the introduction of inter-symbol interference (ISI) is reduced. This aids in increasing the integrity of the data transmitted along the nets of the multi-layer ceramic package and thus, increases the maximum signaling rates and performance of the multi-layer ceramic package.

While the above exemplary embodiments are described as having orthogonal wiring on a glass ceramic module, the present invention is not limited to such. To the contrary, the present invention may be applied to any multi-layered ceramic package in which signal line offsets may be formed with or without the removal of a power/ground via to facilitate these signal line offsets. For example, the present invention may be implemented on 9211 modules, i.e. alumina modules, and with diagonal wiring configurations. Thus, the present invention is equally applicable to any material set that uses signals referenced to meshed planes.

In addition, it should be noted that the techniques for fabricating the multi-layered ceramic package may be any known technique depending upon the particular materials used. For example, a greensheet technique may be used to form a multi-layered ceramic package in accordance with the present invention. A greensheet technique for a multilayer ceramic package fabrication process involves the formation of the green or unfired ceramic layers or sheets, the formation of the conductive paste, the screening of the conductive paste onto the green ceramic sheets and the stacking, laminating and firing of ceramic sheets into the final multilayer ceramic structure. These general processes are known in the art and are described, for example, in U.S. Pat. No. 2,966,719 issued to Park, which is hereby incorporated by reference.

Of course such techniques are modified by introduction of the present invention to include signal line offsets in the signal planes of the multi-layered ceramic package at locations where there are no vias present or where a power/ground via may be removed to facilitate the introduction of the signal line offset, as described previously. Other known fabrication techniques may be used with the present invention without departing from the spirit and scope of the present invention.

Figure 5:
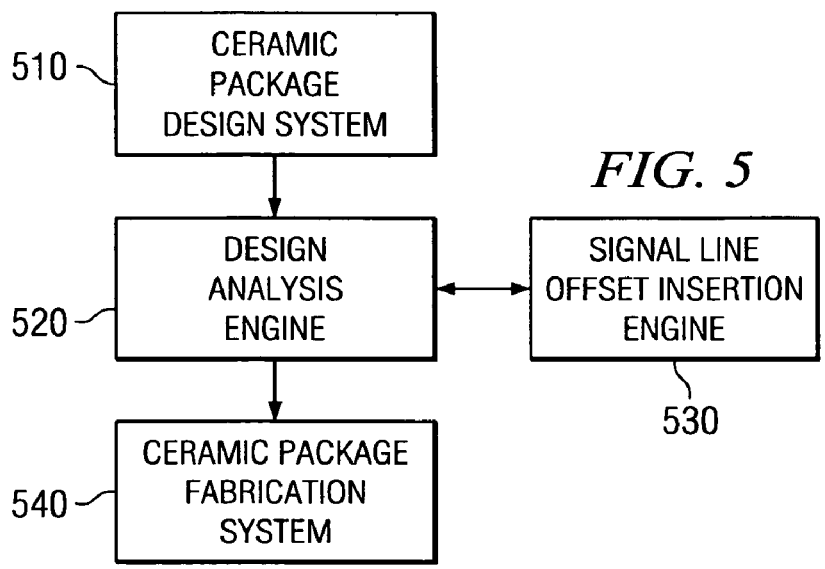
FIG. 5 is an exemplary block diagram of a system for generating a multi-layered ceramic package in accordance with one exemplary embodiment of the present invention.

FIG. 5 is an exemplary block diagram of a system for generating a multi-layered ceramic package in accordance with one exemplary embodiment of the present invention. As shown in FIG. 5, the system includes a ceramic package design system 510 coupled to a design analysis engine 520. Also coupled to the design analysis engine 520 is the signal line offset insertion engine 530 and a ceramic package fabrication system 540. The ceramic package design system 510 provides a design for the multi-layered ceramic package identifying the placement of signal lines, voltage and ground reference mesh layers, voltage and ground vias, and the like. The ceramic package design data is provided to the design analysis engine 520 which analyzes the design to identify, among other things, portions of the multi-layer ceramic package where vias are not present, portions of the multi-layer ceramic package where power/ground vias may be removed without significant detrimental affect to the operation of the multi-layer ceramic package, and thus, portions of the multi-layer ceramic package where signal line offsets may be placed.

Those vias that may be removed without significant detrimental affect may be identified, for example, by analyzing the power/ground line and via portion of the design to identify power/ground vias that are in close proximity to other power/ground vias that can be used to supply power/ground connections to surface devices. If a power/ground via is in close proximity to another power/ground via that can provide the power/ground connection, then the current power/ground via may be removed without significant detrimental affect. This is one example for identifying vias that may be removed, other methods may be used without departing from the spirit and scope of the present invention.

The identified portions of the multi-layer ceramic package where vias are not present or may be removed are provided to the signal line offset insertion engine 530 along with the ceramic package design data. Based on the identified portions of the multi-layer ceramic package, the signal line offset insertion engine 530 inserts signal line offsets into the ceramic package design at the identified locations in the signal planes where there are either no vias or power/ground vias that may be removed. The resulting ceramic package design is provided to the ceramic package fabrication system 540 for fabrication of the multi-layered ceramic package.

It should be appreciated that the elements shown in FIG. 5 may be part of a system that is implemented as an entirely hardware embodiment, an entirely software embodiment or an embodiment containing both hardware and software elements. In a preferred embodiment, the elements shown in FIG. 5 are implemented in software, which includes but is not limited to firmware, resident software, microcode, etc.

Furthermore, the elements of FIG. 5 may take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 6:
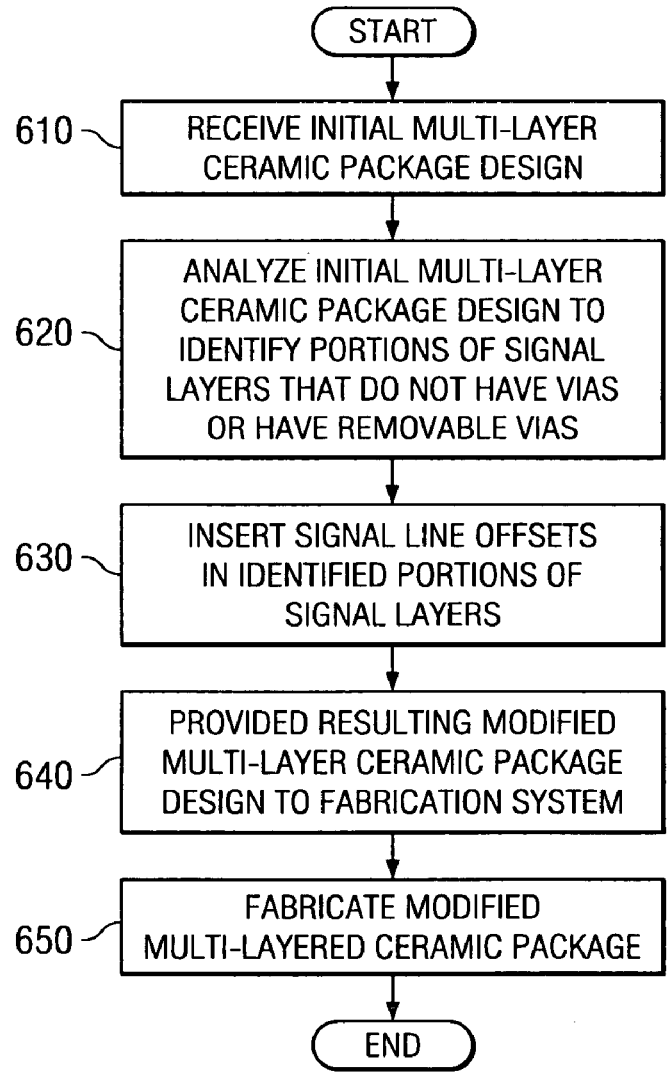
FIG. 6 is a flowchart outlining an exemplary operation of the present invention.

FIG. 6 is a flowchart outlining an exemplary operation of the present invention. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 6, the operation starts by receiving an initial multi-layered ceramic package design (step 610). The initial multi-layered ceramic package design is analyzed to identify portions of multi-layer ceramic package where vias are either not present or power/ground vias may be removed without significant detrimental affect to the operation of the multi-layer ceramic package (step 620). Signal line offsets are inserted into the design at the identified portions of the multi-layer ceramic package where vias are either not present or may be removed (step 630). The number of signal line offsets that are inserted along the length of a signal line may be determined based on a table such as that of Table 2 above, depending upon the amount of reduction in far end noise desired, for example.

The resulting modified multi-layered ceramic package design is then provided to a fabrication system (step 640) which fabricates the multi-layered ceramic package based on the modified multi-layered ceramic package design (step 650). The operation then terminates.

Thus, the present invention provides a mechanism through which far end noise in signal lines of a multi-layer ceramic package may be reduced. The mechanism of the present invention reduces the far end noise by introducing a capacitive cross-talk into the signal lines that negates or reduces the inductive cross-talk already experienced by the signal lines. The capacitive cross-talk is introduce by way of signal line offsets which are capacitively coupled with one another due to the fact that no power/ground line exists directly between these signal line offset to shield the capacitive affects of one signal line on the other.

The above embodiments are described in terms of improving the operation of multi-layer ceramic packages that are subject to a ground rule and ceramic technology in which it is assumed that $K_C < K_L$. Namely, the present invention increases the capacitive cross-talk so as to decrease the inductive noise experienced in the signal lines. However, the present invention also has applications for other types of technologies in which such assumptions do not hold. For example, if ground rule/technology of multi-layer ceramic packages is changed to a point where $K_C > K_L$, i.e. capacitive coupling dominates inductive coupling, the mechanisms of the present invention may be used to "worsen" $K_L$ to compensate for the dominating capacitive coupling.

As described above, in the case were inductive coupling dominates capacitive coupling, $K_L > K_C$, the signal line offset is formed in a plane that is substantially parallel to the voltage/ground reference mesh planes. In a case where capacitive coupling dominates inductive coupling, i.e. $K_C > K_L$, the signal line offsets may be formed in a plane that is substantially perpendicular to the voltage/ground reference mesh planes. In so doing, the inductive cross-talk is increased so as to reduce the affects of the capacitive noise, thereby "worsening" $K_L$.

The multi-layer ceramic packages as described above may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of fabricating a multi-layered ceramic package, comprising:
   receiving an initial multi-layered ceramic package design, wherein the initial multi-layered ceramic package design includes a plurality of signal layers and at least one reference mesh layer adjacent one or more signal layers of the plurality of signal layers;
   inserting, into the initial multi-layered ceramic package design, signal line offsets into a first signal line of a first signal layer and a second signal line of a second signal layer to generate a modified multi-layered ceramic package design; and
   fabricating the multi-layered ceramic package based on the modified multi-layered ceramic package design.

2. The method of claim 1, wherein:
   the at least one reference mesh layer includes either power lines or ground lines;
   a first signal line in a first signal layer, and a second signal line in a second signal layer, includes a signal line offset configured such that there is no power line or ground line directly between the offset in the first signal line and the offset in the second signal line; and
   the signal line offset in the first signal line and the signal line offset in the second signal line are capacitively coupled such that capacitive cross-talk is introduced into at least one of the first signal line and the second signal line to thereby reduce the far end noise in at least one of the first signal line and the second signal line.

3. The method of claim 1, wherein the initial multi-layered ceramic package design further includes one or more vias running through one or more signal layers of the plurality of the signal layers and one or more reference mesh layers of the at least one reference mesh layer.

4. The method of claim 3, further comprising:
   analyzing the initial multi-layered ceramic package design to identify portions of the first signal layer and the second signal layer that do not include the one or more vias.

5. The method of claim 4, wherein inserting signal line offsets into the first signal line and the second signal line includes inserting the signal line offsets at the identified portions of the at least one reference mesh layer that do not include the one or more vias.

6. The method of claim 3, further comprising:
   analyzing the initial multi-layered ceramic package design to identify a via in the one or more vias that may be removed to provide area for insertion of signal line offsets;
   removing the via from the initial multi-layered ceramic package design; and
   inserting the signal line offsets in the first signal line and the second signal line at a portion of the initial multi-layered ceramic package design corresponding to the via that has been removed.

7. The method of claim 1, wherein the at least one reference mesh layer includes at least two reference mesh layers, and wherein each signal layer of the plurality of signal layers is sandwiched between two reference mesh layers of the at least two reference mesh layers.

8. The method of claim 1, wherein the signal line offset in the first signal line and the signal line offset in the second signal line are capacitively coupled such that capacitive cross-talk is introduced into at least one of the first signal line and the second signal line.

9. The method of claim 1, wherein the signal line offsets are arranged as a three approximately orthogonally positioned legs extending from an original signal line path to a position aligned with a center point of a grid square in a mesh reference layer from the center point to an edge of the grid square, and back to the original signal line path.

10. The method of claim 1, wherein the signal line offsets are formed in planes of the plurality of signal layers that are substantially parallel to a plane of the at least one reference mesh layer.

11. The method of claim 1, wherein the signal line offsets are formed in planes of the plurality of signal layers that are substantially perpendicular to a plane of the at least one reference mesh layer.

* * * * *